(12) United States Patent
Yeh et al.

(10) Patent No.: US 12,057,490 B2
(45) Date of Patent: Aug. 6, 2024

(54) HIGH ELECTRON MOBILITY TRANSISTOR STRUCTURE AND METHOD OF FABRICATING THE SAME

(71) Applicant: UNITED MICROELECTRONICS CORP., Hsin-Chu (TW)

(72) Inventors: Chih-Tung Yeh, Taoyuan (TW); Ming-Chang Lu, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 420 days.

(21) Appl. No.: 17/500,954

(22) Filed: Oct. 14, 2021

(65) Prior Publication Data

US 2023/0083904 A1 Mar. 16, 2023

(30) Foreign Application Priority Data

Sep. 14, 2021 (CN) .......................... 202111077470.4

(51) Int. Cl.
*H01L 29/66* (2006.01)
*H01L 29/20* (2006.01)
*H01L 29/778* (2006.01)

(52) U.S. Cl.
CPC .... *H01L 29/66462* (2013.01); *H01L 29/2003* (2013.01); *H01L 29/778* (2013.01)

(58) Field of Classification Search
CPC ........... H01L 29/66462; H01L 29/2003; H01L 29/778; H01L 27/0883; H01L 21/8252; H01L 27/0605; H01L 27/085; H01L 29/1066; H01L 29/0688; H01L 29/4236; H01L 29/7789
See application file for complete search history.

(56) References Cited

U.S. PATENT DOCUMENTS

| | | | |
|---|---|---|---|
| 9,048,303 B1 * | 6/2015 | Ostermaier | ......... H01L 29/0657 |
| 9,461,122 B2 | 10/2016 | Kuraguchi | |
| 10,050,138 B2 * | 8/2018 | Shibata | ............... H01L 29/2003 |

(Continued)

FOREIGN PATENT DOCUMENTS

| | | | | |
|---|---|---|---|---|
| CN | 102683406 A | * | 9/2012 | ....... H01L 29/66462 |
| JP | 2012169470 A | * | 9/2012 | ......... H01L 29/0657 |

(Continued)

OTHER PUBLICATIONS

Posthuma, "Impact of Mg out-diffusion and activation on the p-GaN gate HEMT device performance", pp. 95-98, Proceedings of the 2016 28th International Symposium on Power Semiconductor Devices and ICs (ISPSD), Jun. 12, 2016.

(Continued)

*Primary Examiner* — Jarrett J Stark
(74) *Attorney, Agent, or Firm* — Winston Hsu (57) ABSTRACT

A high electron mobility transistor includes a substrate. A first III-V compound layer is disposed on the substrate. A second III-V compound layer is embedded within the first III-V compound layer. A P-type gallium nitride gate is embedded within the second III-V compound layer. A gate electrode is disposed on the second III-V compound layer and contacts the P-type gallium nitride gate. A source electrode is disposed at one side of the gate electrode. A drain electrode is disposed at another side of the gate electrode.

13 Claims, 7 Drawing Sheets

(56) References Cited

U.S. PATENT DOCUMENTS

| | | | | |
|---|---|---|---|---|
| 11,563,114 B2* | 1/2023 | Smith | ................ | H01L 29/7786 |
| 2009/0267078 A1* | 10/2009 | Mishra | .............. | H01L 29/66462 |
| | | | | 257/E21.403 |
| 2010/0159656 A1* | 6/2010 | Nakata | ................ | H01L 29/7788 |
| | | | | 257/E21.409 |
| 2010/0259321 A1* | 10/2010 | Tserng | ................ | H01L 29/7787 |
| | | | | 257/280 |
| 2013/0083567 A1 | 4/2013 | Imada | | |
| 2014/0346523 A1* | 11/2014 | Chang | ................ | H01L 29/7787 |
| | | | | 438/172 |
| 2016/0300941 A1* | 10/2016 | Cheng | ................ | H01L 29/1037 |
| 2018/0083133 A1* | 3/2018 | Bayram | ............... | H01L 29/517 |
| 2020/0027977 A1* | 1/2020 | Tajima | ................ | H01L 29/4236 |
| 2021/0013334 A1* | 1/2021 | Huang | .............. | H01L 21/26546 |
| 2021/0210627 A1* | 7/2021 | Moens | ................ | H01L 29/4236 |
| 2021/0384339 A1* | 12/2021 | Sun | ....................... | H01L 29/205 |
| 2022/0199780 A1* | 6/2022 | Cheng | ................ | H01L 29/7786 |
| 2022/0392887 A1* | 12/2022 | Yanagihara | ........... | H01L 29/861 |
| 2022/0393026 A1* | 12/2022 | Escoffier | ............. | H01L 29/7817 |
| 2023/0007832 A1* | 1/2023 | Shen | ................ | H01L 29/66462 |
| 2023/0083904 A1* | 3/2023 | Yeh | .................... | H01L 29/1066 |
| | | | | 257/183 |
| 2023/0420498 A1* | 12/2023 | Tai | ........................ | H01L 29/402 |

FOREIGN PATENT DOCUMENTS

| | | | | |
|---|---|---|---|---|
| WO | WO-2015122135 A1 * | 8/2015 | .......... | H01L 29/045 |
| WO | WO-2022176455 A1 * | 8/2022 | ......... | H01L 29/2003 |

OTHER PUBLICATIONS

Lan, "Improved Surface Morphology and Edge Definition for Ohmic Contacts to AlGaN/GaN Heterostructures", Proceedings vol. 7216, Gallium Nitride Materials and Devices IV; 72162P (2009), Feb. 2009.

Luo, "Improved morphology for ohmic contacts to AlGaN/GaN high electron mobility transistors using WSix- or W-based metallization", Applied Physics Letters vol. 82, No. 22, Jun. 2, 2003.

* cited by examiner

HIGH ELECTRON MOBILITY TRANSISTOR STRUCTURE AND METHOD OF FABRICATING THE SAME

BACKGROUND OF THE INVENTION

1. Field of the Invention

The present invention relates to a high electron mobility transistor (HEMT) structure and a method of fabricating the same, and more particular to an HEMT with a high break down voltage and a low on-state resistance and a method of fabricating the high electron mobility transistor.

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a heterojunction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, in order to deal with the increase in the integration of semiconductor components, it is necessary to increase the break down voltage of high electron mobility transistors and reduce the on-resistance of high electron mobility transistors.

SUMMARY OF THE INVENTION

In light of above, the present invention provides an HEMT structure to meet the above-mentioned requirements without increasing the total thickness of the HEMT.

According to a preferred embodiment of the present invention, a high electron mobility transistor includes a substrate. A first III-V compound layer is disposed on the substrate. A second III-V compound layer is embedded within the first III-V compound layer, wherein a composition of the first III-V compound layer is different from a composition of the second III-V compound layer. A P-type gallium nitride gate is embedded within the second III-V compound layer. A gate electrode is disposed on the second III-V compound layer and contacts the P-type gallium nitride gate. A source electrode is disposed at one side of the gate electrode, on the second III-V compound layer, and contacts the second III-V compound layer and the first III-V compound layer. A drain electrode is disposed at another side of the gate electrode, on the second III-V compound layer, and contacting the second III-V compound layer and the first III-V compound layer.

According to another preferred embodiment of the present invention, a fabricating method of a high electron mobility transistor includes forming a normally-off transistor, wherein steps of fabricating the normally-off transistor includes providing a substrate and a first III-V compound layer disposed on the substrate. Then, the first III-V compound layer is etched to form a first trench. A first epitaxial process is performed to form a second III-V compound layer filling up the first trench. Later, the second III-V compound layer is etched to form a second trench. A second epitaxial process is performed to form a P-type gallium nitride gate filling up the second trench. Subsequently, a first gate electrode is formed, wherein the first gate electrode is disposed on the second III-V compound layer and contacts the P-type gallium nitride gate. Finally, a first source electrode and a first drain electrode are formed, wherein the first source electrode and the first drain electrode are respectively disposed at two sides of the first gate electrode, both of the first source electrode and the first drain electrode are on the second III-V compound layer and contact the second III-V compound layer and the first III-V compound layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2A, FIG. 3 to FIG. 8 depict a fabricating method of a high electron mobility transistor structure according to a preferred embodiment of the present invention, wherein:

DETAILED DESCRIPTION

Figure 2A:
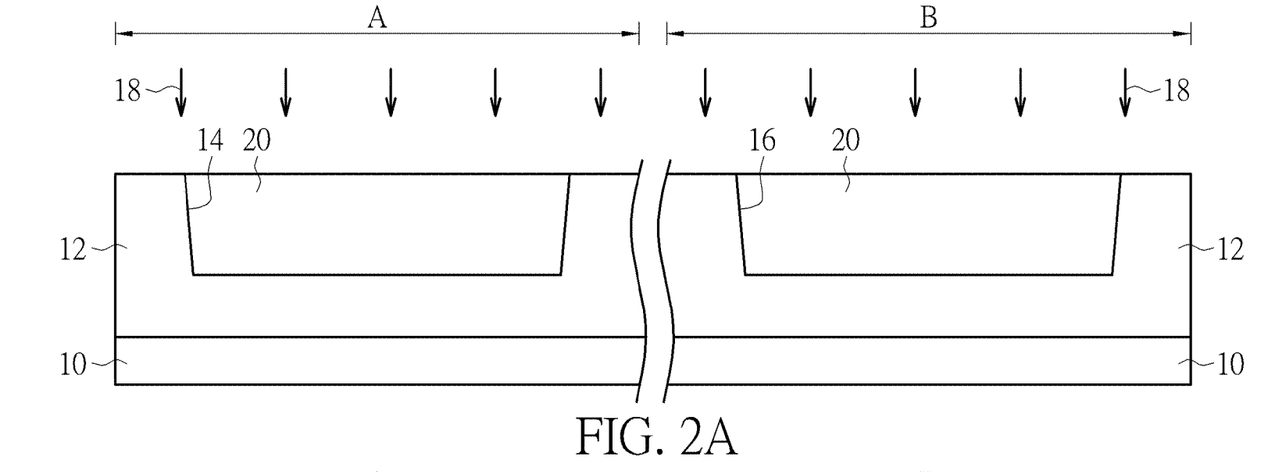
FIG. 2A is a fabricating stage following FIG. 1.
Figure 3:
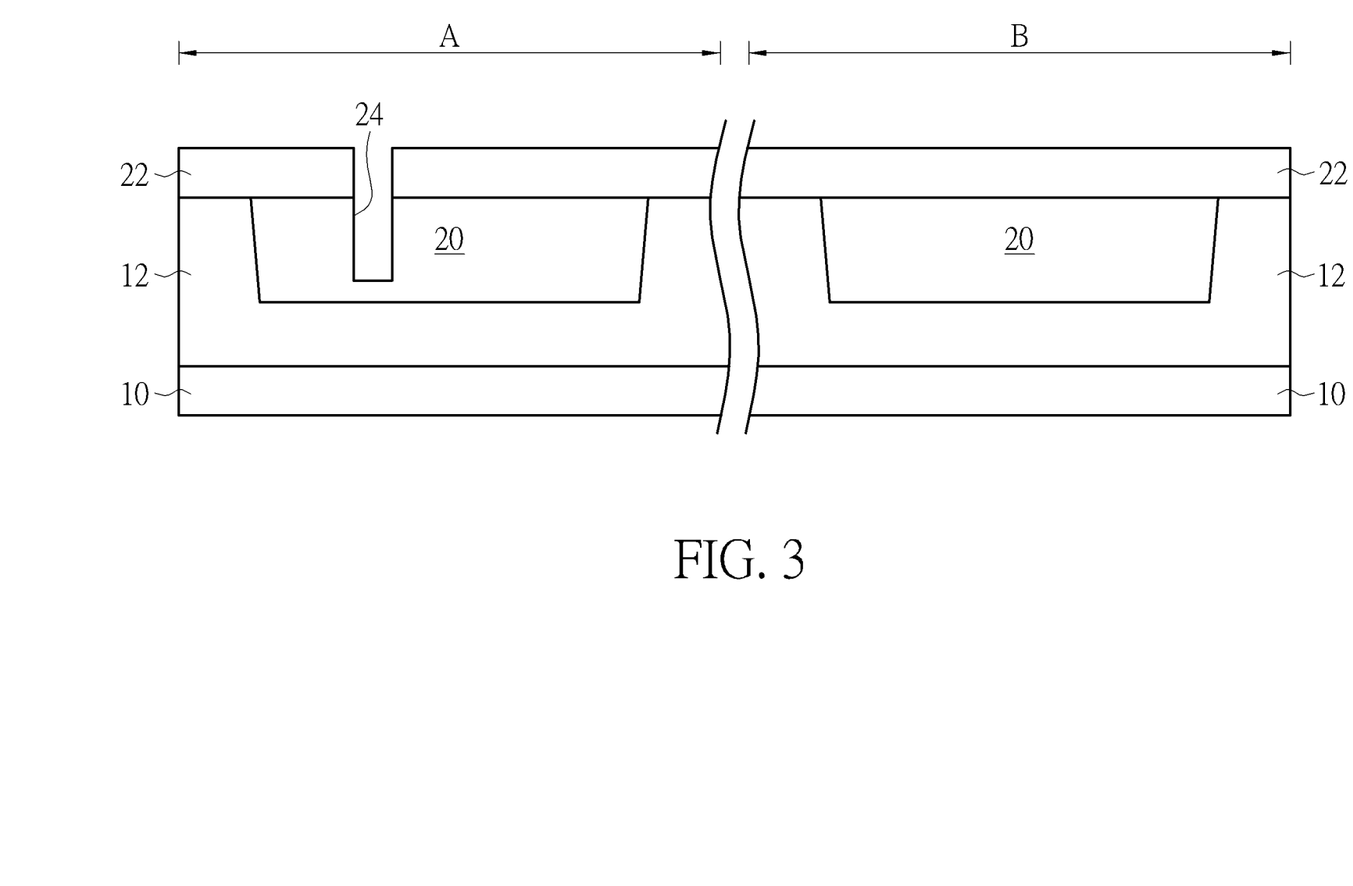
FIG. 3 is a fabricating stage following FIG. 2A.
Figure 4:
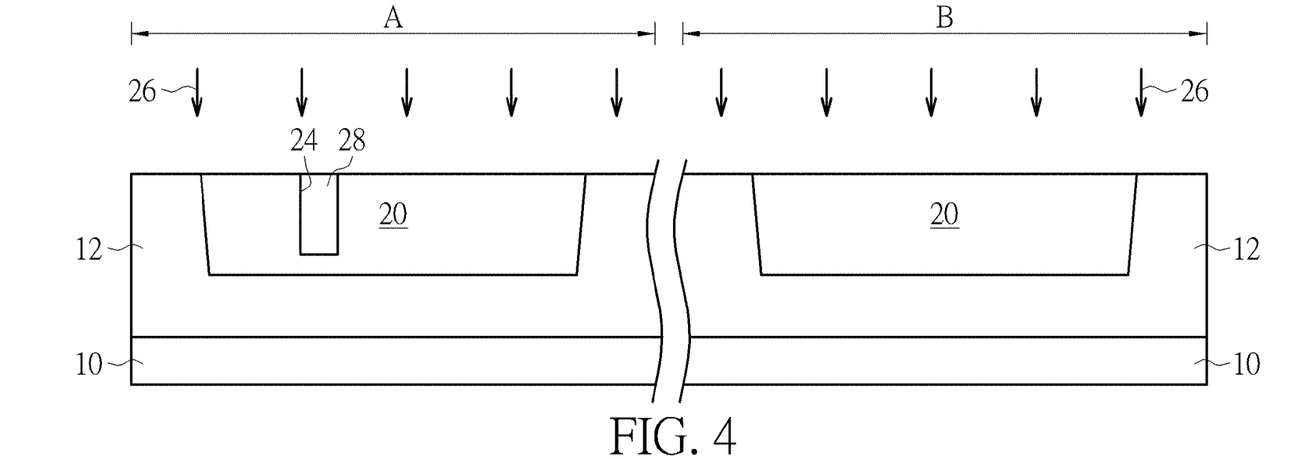
FIG. 4 is a fabricating stage following FIG. 3.
Figure 5:
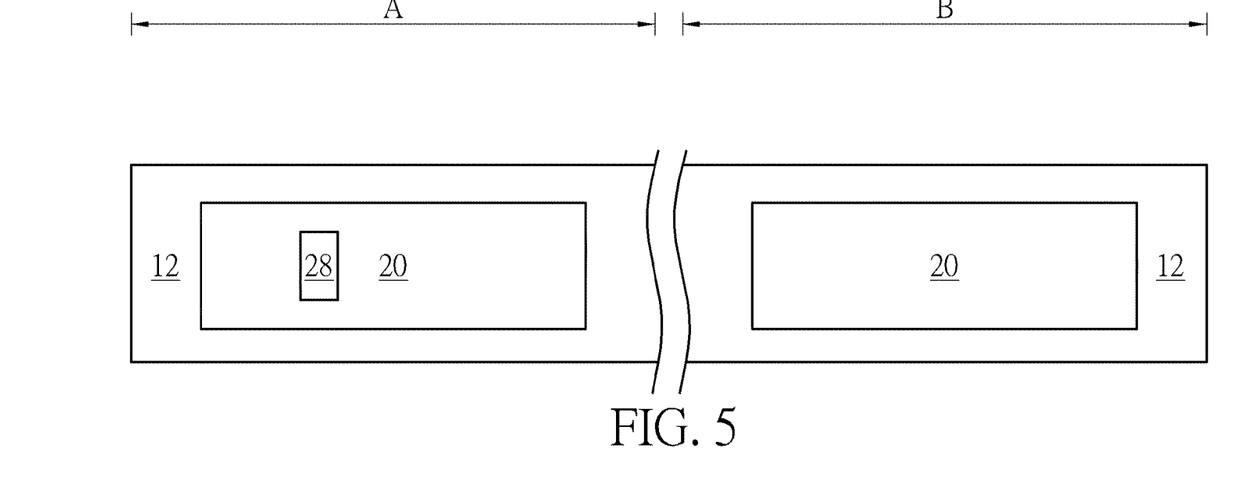
FIG. 5 depicts a top view of FIG. 4.

FIG. 1, FIG. 2A, FIG. 3 to FIG. 8 depict a fabricating method of a high electron mobility transistor structure according to a preferred embodiment of the present invention, wherein FIG. 5 depicts a top view of FIG. 4.

Figure 1:
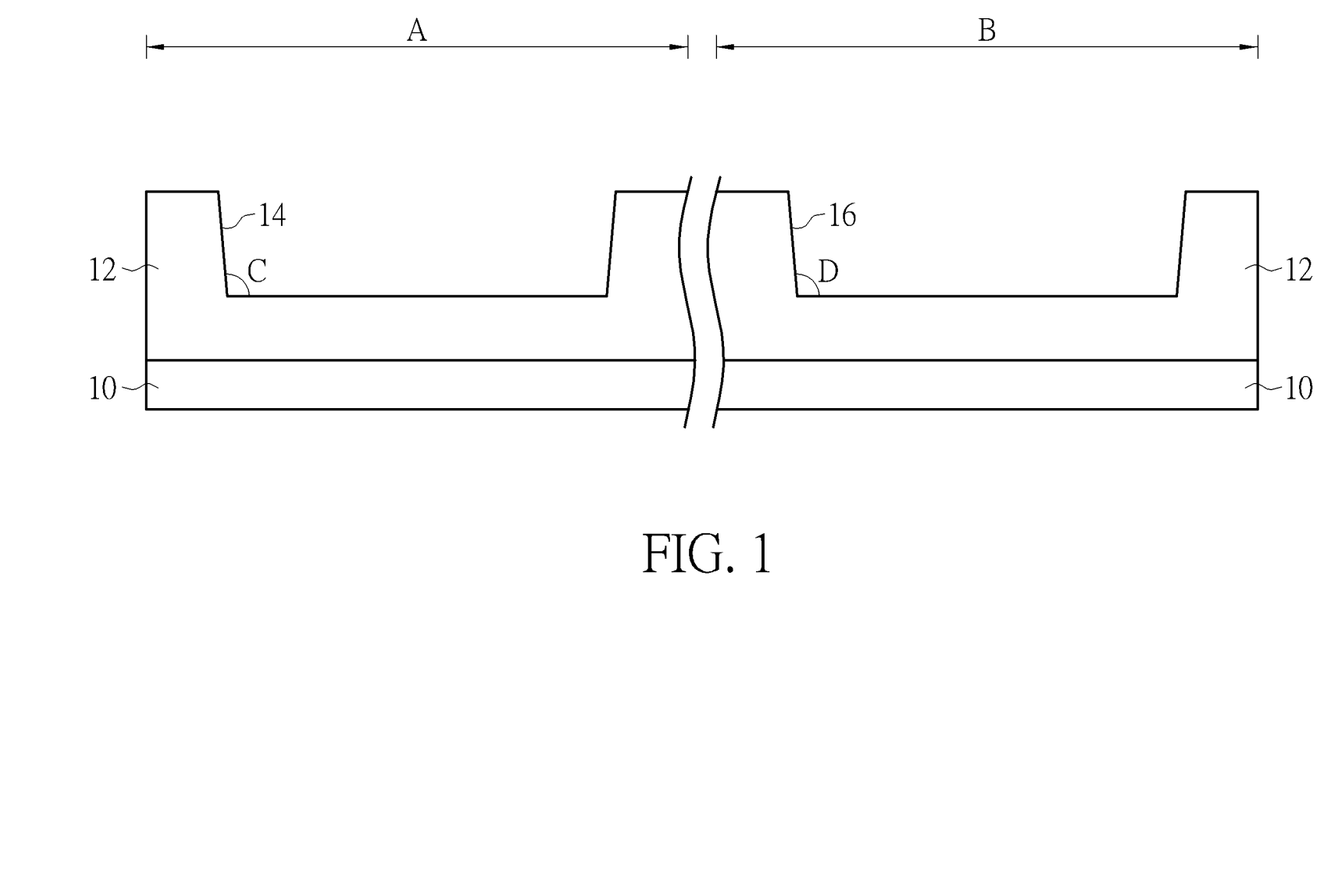
FIG. 1 shows a substrate with a first III-V compound layer.

As shown in FIG. 1, a substrate 10 is provided. The substrate 10 is divided into a normally-off transistor region A and a normally-on transistor region B. A first III-V compound layer 12 is disposed on the substrate 10 and covers the normally-off transistor region A and the normally-on transistor region B. Next, the first III-V compound layer 12 is etched to form a first trench 14 and a third trench 16. The first trench 14 is disposed within the normally-off transistor region A. The third trench 16 is disposed within the normally-on transistor region B. The etching process is preferably a dry etching process. It is noteworthy that a first obtuse angle C is defined between the bottom of the first trench 14 and a sidewall of the first trench 14. A second obtuse angle D is defined between the bottom of the third trench 16 and a sidewall of the third trench 16. The first obtuse angle C is preferably between 120 and 150 degrees. The second obtuse angle D is preferably between 120 and 150 degrees.

As shown in FIG. 2A, a first epitaxial process 18 is performed to form a second III-V compound layer 20 to fill up the first trench 14 and the third trench 16. The first epitaxial process 18 includes metal-organic chemical vapor deposition (MOCVD) or molecular beam epitaxy (MBE). The top surface of the second III-V compound layer 20 is aligned with the top surface of the first III-V compound layer 12.

Figure 2B:
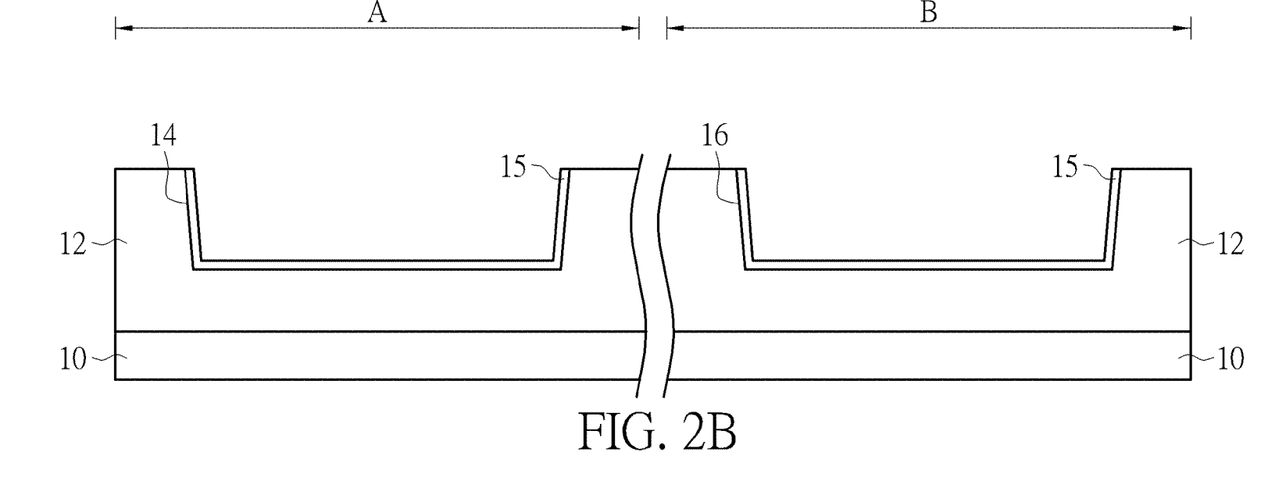
FIG. 2B depicts an optional fabricating stage following FIG. 2A.

According to another preferred embodiment of the present invention, as shown in FIG. 2B, before the first epitaxial process 18, an aluminum nitride layer 15 can be optionally conformally formed to cover the first trench 14 and the third trench 16. Later, steps in FIG. 2A is performed to formed the second III-V compound layer 20 covering the aluminum nitride layer 15. The thickness of the aluminum nitride layer 15 is preferably between 1 and 2 nanometer.

FIG. 3 depicts steps in continuous from FIG. 2A. As shown in FIG. 3, a mask 22 is formed to cover the normally-on transistor region B. Later, the second III-V compound layer 20 within the normally-on transistor region B is etched to form a second trench 24. The depth of the second trench 24 is preferably between 40 and 90 nanometers. As show in FIG. 4, a second epitaxial process 26 is performed to form a P-type gallium nitride gate 28 filling up the second trench 24. The second epitaxial process 26 includes metal-organic chemical vapor deposition (MOCVD) or molecular beam epitaxy (MBE). After the P-type gallium nitride gate 28 is formed, the mask 22 is removed. Please refer to FIG. 4 and FIG. 5, under a top view, in the normally-off transistor region A, the first III-V compound layer 12 surrounds the second III-V compound layer 20, and the second III-V compound layer 20 surrounds the P-type gallium nitride gate 28. In the normally-on transistor region B, the first III-V compound layer 12 surrounds the second III-V compound layer 20. Moreover, as shown in FIG. 4, in the normally-off transistor region A, the top surface of the second III-V compound layer 20, the top surface of the first III-V compound layer 12 and the top surface of the P-type gallium nitride gate 28 are aligned. In the normally-on transistor region B, the top surface of the first III-V compound layer 12 and the top surface of the top surface of the second III-V compound layer 20 are aligned.

Figure 6:
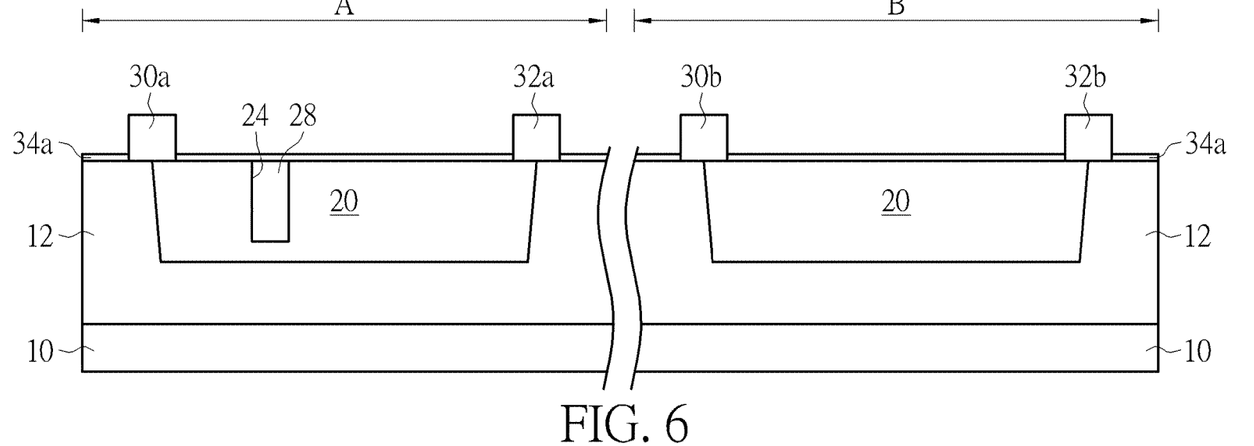
FIG. 6 is a fabricating stage following FIG. 4.
Figure 7:
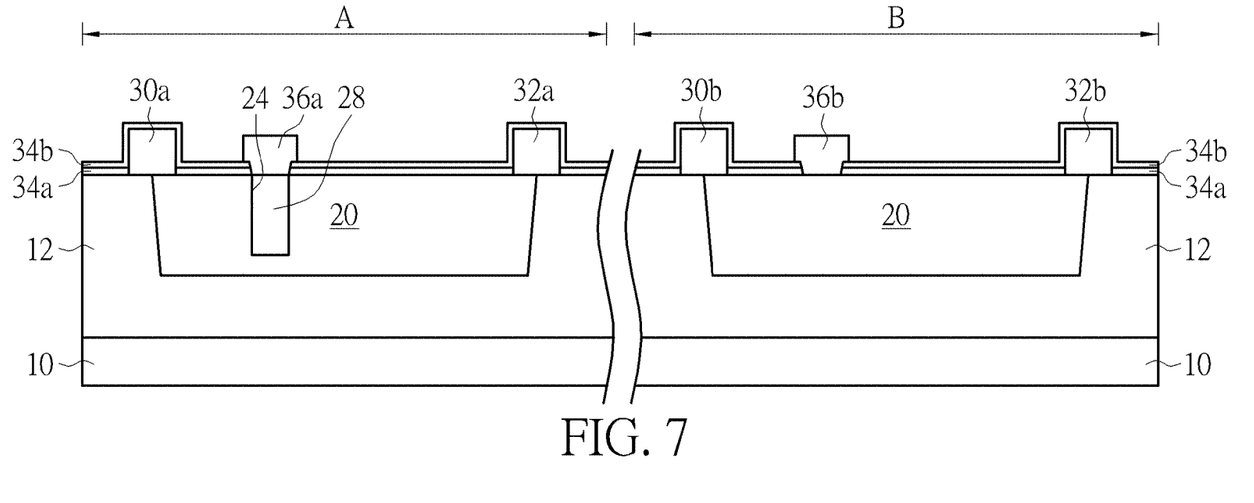
FIG. 7 is a fabricating stage following of FIG. 6.

As shown in FIG. 6, a first source electrode 30a and a first drain electrode 32a, a second source electrode 30b and a second drain electrode 32b are simultaneously formed on the second III-V compound layer 20. The first source electrode 30a, the first drain electrode 32a, the second source electrode 30b and the second drain electrode 32b are on the second III-V compound layer 20 and contact the second III-V compound layer 20 and the first III-V compound layer 12. According to a preferred embodiment of the present invention, the fabricating steps of the first source electrode 30a, the first drain electrode 32a, the second source electrode 30b and the second drain electrode 32b includes forming a protective layer 34a covering the second III-V compound layer 20 and the first III-V compound layer 12 before forming the first source electrode 30a, the first drain electrode 32a, the second source electrode 30b and the second drain electrode 32b. Next, the protective layer 34a is etched to form numerous openings within the protective layer 34a to expose interfaces between the first III-V compound layer 12 and the second III-V compound layer 20. Next, a metal layer (not shown) is deposited to fill in the openings and cover the protective layer 34a. Then, the metal layer is patterned to form the first source electrode 30a, the first drain electrode 32a, the second source electrode 30b and the second drain electrode 32b. As shown in FIG. 7, a first gate electrode 36a and a second gate electrode 36b are formed simultaneously. The first gate electrode 36a is on the second III-V compound layer 20 within the normally-off transistor region A and the first gate electrode 36a contacts the P-type gallium nitride gate 28. The second gate electrode 36b is on the second III-V compound layer 20 within the normally-on transistor region B. In details, a protective layer 34b is formed to cover the protective layer 34a, the first source electrode 30a, a first drain electrode 32a, a second source electrode 30b and the second drain electrode 32b before forming the first gate electrode 36a and the second gate electrode 36b. Subsequently, two openings are formed within the protective layer 34b. One of the openings exposes the P-type gallium nitride gate 28, and the other of the openings exposes the second III-V compound layer 20 within the normally-on transistor region B. Later, a metal layer (not shown) is formed by a deposition process to fill in the openings and cover the protective layer 34b. Next, the metal layer is patterned to form the first gate electrode 36a and the second gate electrode 36b.

Figure 8:
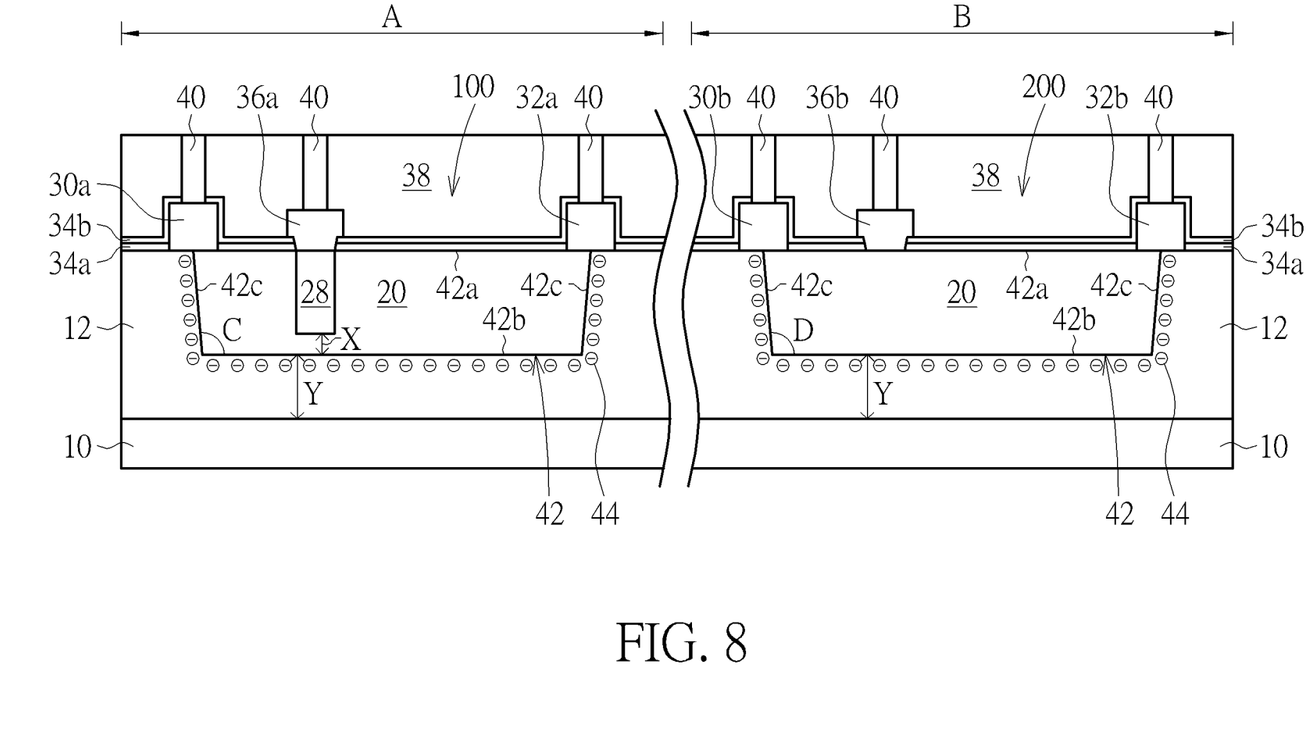
FIG. 8 is a fabricating stage following of FIG. 7.

As shown in FIG. 8, an interlayer dielectric 38 is formed to cover the normally-off transistor region A and the normally-on transistor region B. Later, numerous conductive plugs 40 are formed to penetrate the interlayer dielectric 38 and respectively contact the first gate electrode 36a, the first source electrode 30a, the first drain electrode 32a, the second gate electrode 36b, the second source electrode 30b and the second drain electrode 32b. Now, a normally-off HEMT (high electron mobility transistor) 100 and a normally-on HEMT 200 of the present invention are completed.

Furthermore, according to another preferred embodiment, the first gate electrode 36a and the second gate electrode 36b can be formed followed by forming the first source electrode 30a, the first drain electrode 32a, the second source electrode 30b and the second drain electrode 32b.

FIG. 8 depicts an HEMT structure of the present invention according to a preferred embodiment of the present invention. As shown in FIG. 8, an HEMT structure includes a substrate 10. The substrate 10 is divided into a normally-off transistor region A and a normally-on transistor region B. A normally-off HEMT transistor 100 is disposed within the normally-off transistor region A. A normally-on HEMT transistor 200 is disposed within the normally-on transistor region B. The HEMT structure includes a first III-V compound layer 12 disposed within the normally-off transistor region A and within the normally-on transistor region B of the substrate 10. Two second III-V compound layers 20 respectively embedded in the first III-V compound layer 12 within the normally-off transistor region A and in the first III-V compound layer 12 within the normally-on transistor region B. The composition of the second III-V compound layer 20 is different from the composition of the first III-V compound layer 12. It is noteworthy that both of the two second III-V compound layers 20 respectively include a trapezoid 42 under a cross-sectional view. The trapezoid 42 includes an upper base 42a a lower base 42b, and two legs 42c. The upper base 42a is aligned with a top surface of the first III-V compound layer 12. The upper base 42a is longer than the lower base 42c. An obtuse angle C is defined between one of the legs 42c and the lower base 42b within the normally-off transistor region A. An obtuse angle D is defined between one of the legs 42c and the lower base 42b within the normally-on transistor region B. According to a preferred embodiment of the present invention, the obtuse angle C and the obtuse angle D are respectively between 120 and 150 degrees. If the angle between the leg and the lower base 42b is smaller than 90 degrees i.e. not an obtuse angle, two dimensional electron gas 44 will not be generated. Because when the angle is smaller than 90 degrees, facet of the second III-V compound layer 20 can not generate two dimensional electron gas 44. A P-type gallium nitride gate 28 is embedded within the second III-V compound layers 20 within the normally-off transistor region A. There is no P-type gallium nitride gate 28 disposed within the normally-off transistor region B. Moreover, the P-type gallium nitride gate 28 does not contact the first III-V compound layer 12. Please refer to FIG. 5, under a top view, in the normally-off transistor region A, the first III-V compound layer 12 surrounds the second III-V compound layer 20, and the second III-V compound layer 20 surrounds the P-type gallium nitride gate 28. In the normally-on transistor region B, the first III-V compound layer 12 surrounds the second III-V compound layer 20.

A first gate electrode 36a is on the second III-V compound layer 20 within the normally-off transistor region A and the first gate electrode 36a contacts the P-type gallium nitride gate 28. The second gate electrode 36b is on the second III-V compound layer 20 within the normally-on transistor region B. A first gate electrode 36a is disposed on the second III-V compound layer 20 and contacts the P-type gallium nitride gate 28. The first source electrode 30a and the first drain electrode 32a are respectively disposed at two opposed sides of the first gate electrode 36a, on the second III-V compound layer 20 within the normally-off transistor region A and contact the second III-V compound layer 20 and the first III-V compound layer 12. The second gate electrode 36b is on the second III-V compound layer 20 within the normally-on transistor region B. A second source electrode 30b and a second drain electrode 32b are respectively disposed at two opposed sides of the second gate electrode 36b, on the second III-V compound layer 20 within the normally-on transistor region B and contact the second III-V compound layer 20 and the first III-V compound layer 12. The first source electrode 30a, the first drain electrode 32a, the second source electrode 30b and the second drain electrode 32b respectively contact the interfaces between the first III-V compound layer 12 and the second III-V compound layer 20. Two dimensional electron gas 44 generates between the second III-V compound layer 20 and the first III-V compound layer 12. The two dimensional electron gas 44 has a trench profile. Because two dimensional electron gas 44 generates at the interface between the second III-V compound layer 20 and the first III-V compound layer 12, the first source electrode 30a, the first drain electrode 32a, the second source electrode 30b and the second drain electrode 32b need to contact the interface between the second III-V compound layer 20 and the first III-V compound layer 12 to connect the two dimensional electron gas 44. A protective layer 34a covers the first III-V compound layer 12 and the second III-V compound layer 20. A protective layer 34b covers the protective layer 34a. The normally-off HEMT transistor 100 is formed by the first III-V compound layer 12, the second III-V compound layers 20, the P-type gallium nitride gate 28, the first gate electrode 36a, the first source electrode 30a and the first drain electrode 32a. The normally-on HEMT transistor 200 is formed by the first III-V compound layer 12, the second III-V compound layers 20, the second gate electrode 36b, the second source electrode 30b and the second drain electrode 32b.

An interlayer dielectric 38 covers the normally-off HEMT transistor 100 and normally-on HEMT transistor 200. Numerous conductive plugs 40 penetrate the interlayer dielectric 38 and respectively contact the first gate electrode 36a, the first source electrode 30a, the first drain electrode 32a, the second gate electrode 36b, the second source electrode 30b and the second drain electrode 32b.

A distance X is between a bottom of the P-type gallium nitride gate 28 and the first III-V compound layer 12. The distance X is perpendicular to a top surface of the substrate 10, and the distance X is between 10 and 20 nanometers. A thickness of each of the second III-V compound layers 20 is between 50 and 100 nanometers. A thickness of the P-type gallium nitride gate 28 is between 40 and 90 nanometers. A distance Y is between a bottom of the second III-V compound layer 20 and a top surface of the substrate 10. The distance Y is between 2 and 6 micrometers. The first III-V compound layer 12 includes gallium nitride (GaN), indium gallium nitride ($In_xGa_{1-x}N$), aluminum gallium nitride ($Al_xGa_{1-x}N$), aluminum indium nitride ($Al_xIn_{1-x}N$), aluminum indium gallium nitride ($Al_{1-x-y}In_xGa_yN$) or aluminum nitride (AlN). In this embodiment, the first III-V compound layer 12 is preferably gallium nitride. The second III-V compound layer 20 includes aluminum gallium nitride, aluminum indium nitride, aluminum indium gallium nitride, or aluminum nitride. In this embodiment, the second III-V compound layer 20 is preferably aluminum gallium nitride. A thickness of the second III-V compound layer 20 is about 100 nanometers.

The substrate 10 is preferably a silicon substrate with (1,1,1) facet. The P-type gallium nitride gate 28 can be formed by doping magnesium into gallium nitride. Protective layers 34a/34b include silicon nitride or aluminum nitride. The first gate electrode 36a, the first source electrode 30a, the first drain electrode 32a, the second gate electrode 36b, the second source electrode 30b and the second drain electrode 32b respectively include Ti, Al, Ni, Pt or Au.

Figure 9:
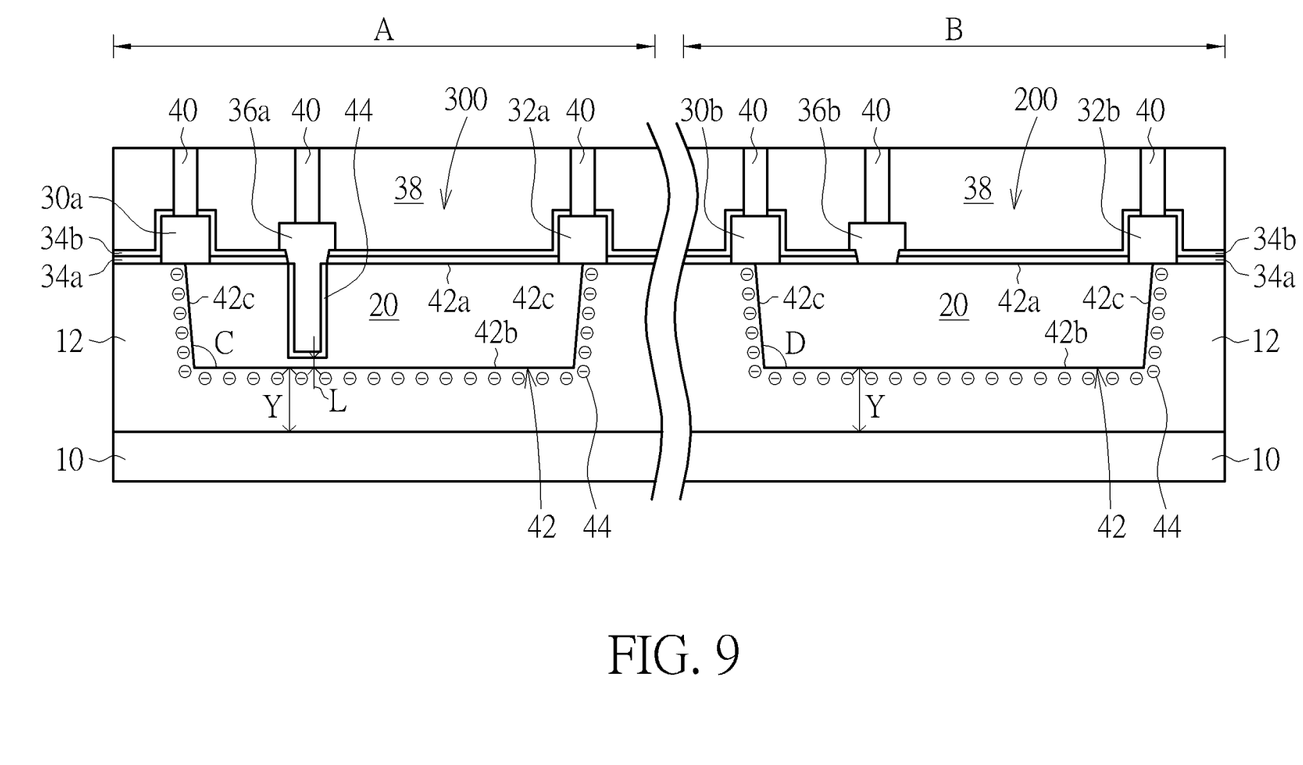
FIG. 9 depicts an HEMT structure according to another preferred embodiment of the present invention.

FIG. 9 depicts an HEMT structure according to another preferred embodiment of the present invention, wherein elements which are substantially the same as those in the embodiment of FIG. 8 are denoted by the same reference numerals; an accompanying explanation is therefore omitted. The difference between FIG. 8 and FIG. 9 is that the HEMT 300 in FIG. 9 uses a recessed gate electrode to achieve the normally off mode. That is, the normally-off HEMT 300 does not have the P-type gallium nitride gate. Furthermore, the first gate electrode 36a extends into the second III-V compound layer 20. A gate insulating layer 44 is disposed around the first gate electrode 36a. A distance L is between a bottom of the first gate electrode 36a and the first III-V compound layer 12. The distance L is perpendicular to the top surface of the substrate 10. The distance L is preferably between 1 and 2 nanometers. In another preferred embodiment, the first gate electrode 36a segments the second III-V compound layer 20, and the first gate electrode 36a extends into the first III-V compound layer 12.

The thickness of the second III-V compound layer in the present invention is increased intentionally to raise the break down voltage of the HEMT, increase the concentration of the two dimensional electron gas, and lower the on-state resistance. However, with respective to the normally-off HEMT, the thickness of the P-type gallium nitride gate should be increased when the thickness of the second III-V compound layer is raised so as to maintain the normally-off property. Therefore, the second III-V compound layer is intentionally embedded within the first III-V compound layer, and the P-type gallium nitride gate is intentionally embedded within the second III-V compound layer to avoid the totally thickness of the HEMT from increasing. Moreover, because the second III-V compound layer embedded into the first III-V compound layer leading to the two dimensional electron gas becoming a trench profile, the first source electrode, the first drain electrode, the second source electrode and the second drain electrode can be formed without etching the first III-V compound layer and the second III-V compound layer, and the first source electrode, the first drain electrode, the second source electrode and the second drain electrode can still contact the two dimensional electron gas.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor structure, comprising
   a substrate;
   a first III-V compound layer disposed on the substrate;
   a second III-V compound layer embedded within the first III-V compound layer, wherein a composition of the first III-V compound layer is different from a composition of the second III-V compound layer;
   a P-type gallium nitride gate embedded within the second III-V compound layer, wherein when seeing from a top view, the P-type gallium nitride gate is deviated from a center of the second III-V compound layer;
   a gate electrode disposed on the second III-V compound layer and contacting the P-type gallium nitride gate;
   a source electrode disposed at one side of the gate electrode, on the second III-V compound layer, and contacting the second III-V compound layer and the first III-V compound layer; and
   a drain electrode disposed at another side of the gate electrode, on the second III-V compound layer, and contacting the second III-V compound layer and the first III-V compound layer.

2. The high electron mobility transistor structure of claim 1, wherein a sectional view of the second III-V compound layer comprises a trapezoid, the trapezoid comprises a upper base, a lower base, and two legs, wherein the upper base is aligned with a top surface of the first III-V compound layer, and the upper base is longer than the lower base.

3. The high electron mobility transistor structure of claim 2, wherein an obtuse angle is defined between one of the legs and the lower base.

4. The high electron mobility transistor structure of claim 2, wherein the obtuse angle is between 120 and 150 degrees.

5. The high electron mobility transistor structure of claim 1, wherein the first III-V compound layer surrounds the second III-V compound layer, and the second III-V compound layer surrounds the P-type gallium nitride gate.

6. The high electron mobility transistor structure of claim 1, wherein the P-type gallium nitride gate does not contact the first III-V compound layer.

7. The high electron mobility transistor structure of claim 1, wherein a distance is between a bottom of the P-type gallium nitride gate and the first III-V compound layer, the distance is perpendicular to a top surface of the substrate, and the distance is between 10 and 20 nanometers.

8. The high electron mobility transistor structure of claim 1, wherein a top surface of the second III-V compound layer, a top surface of the first III-V compound layer and a top surface of the P-type gallium nitride gate are aligned.

9. The high electron mobility transistor structure of claim 1, wherein a thickness of the second III-V compound layer is between 50 and 100 nanometers.

10. The high electron mobility transistor structure of claim 1, wherein a distance from a bottom of the second III-V compound layer to a top surface of the substrate is between 2 and 6 micrometers.

11. The high electron mobility transistor structure of claim 1, wherein two dimensional electron gas generates between the first III-V compound layer and the second III-V compound layer, and the two dimensional electron gas has a trench profile.

12. The high electron mobility transistor structure of claim 1, wherein the first III-V compound layer is gallium nitride, the second III-V compound layer comprises aluminum gallium nitride, aluminum indium nitride, aluminum indium gallium nitride or aluminum nitride.

13. The high electron mobility transistor structure of claim 1, further comprising an aluminum nitride layer disposed between the first III-V compound layer and the second III-V compound layer.

* * * * *